United States Patent
Koulierakis et al.

(10) Patent No.: US 11,740,560 B2
(45) Date of Patent: Aug. 29, 2023

(54) METHOD FOR DETERMINING AN INSPECTION STRATEGY FOR A GROUP OF SUBSTRATES IN A SEMICONDUCTOR MANUFACTURING PROCESS

(71) Applicant: ASML NETHERLANDS B.V., Veldhoven (NL)

(72) Inventors: Eleftherios Koulierakis, Eindhoven (NL); Carlo Lancia, Eindhoven (NL); Juan Manuel Gonzalez Huesca, Eindhoven (NL); Alexander Ypma, Veldhoven (NL); Dimitra Gkorou, Eindhoven (NL); Reza Sahraeian, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/910,454

(22) PCT Filed: Mar. 1, 2021

(86) PCT No.: PCT/EP2021/054988
§ 371 (c)(1),
(2) Date: Sep. 9, 2022

(87) PCT Pub. No.: WO2021/197730
PCT Pub. Date: Oct. 7, 2021

(65) Prior Publication Data
US 2023/0058166 A1    Feb. 23, 2023

(30) Foreign Application Priority Data

Apr. 2, 2020  (EP) .................................... 20167648
May 13, 2020 (EP) .................................... 20174335
Sep. 28, 2020 (EP) .................................... 20198754

(51) Int. Cl.
*G03F 7/20* (2006.01)
*G03F 7/00* (2006.01)

(52) U.S. Cl.
CPC ............................. *G03F 7/70525* (2013.01)

(58) Field of Classification Search
CPC ... G03F 7/705; G03F 7/70525; H04N 19/105; H04N 19/11; H04N 19/132;
(Continued)

(56) References Cited

U.S. PATENT DOCUMENTS 5,229,872 A   7/1993  Mumola
5,296,891 A   3/1994  Vogt et al.
(Continued)

FOREIGN PATENT DOCUMENTS

TW    201640229    11/2016
WO    99/49504     9/1999
(Continued)

OTHER PUBLICATIONS

International Search Report and Written Opinion issued in corresponding PCT Patent Application No. PCT/EP2020/054988, dated May 27, 2021.
(Continued)

*Primary Examiner* — Deoram Persaud
(74) *Attorney, Agent, or Firm* — Pillsbury Winthrop Shaw Pittman, LLP (57) ABSTRACT

A method for determining an inspection strategy for at least one substrate, the method including: quantifying, using a prediction model, a compliance metric value for a compliance metric relating to a prediction of compliance with a quality requirement based on one or both of pre-processing data associated with the substrate and any available post-processing data associated with the at least one substrate; and deciding on an inspection strategy for the at least one
(Continued)

substrate, based on the compliance metric value, an expected cost associated with the inspection strategy and at least one objective value describing an expected value of the inspection strategy in terms of at least one objective relating to the prediction model.

20 Claims, 5 Drawing Sheets

(58) Field of Classification Search
CPC .. H04N 19/157; H04N 19/176; H04N 19/593; H04N 19/70
See application file for complete search history.

(56) References Cited

U.S. PATENT DOCUMENTS

| | | | |
|---|---|---|---|
| 5,523,193 | A | 6/1996 | Nelson |
| 6,925,253 | B2 | 8/2005 | Miyatake |
| 8,208,140 | B2 | 6/2012 | Hulsebos et al. |
| 2006/0016561 | A1 | 1/2006 | Choi et al. |
| 2007/0085991 | A1 | 4/2007 | Liegl et al. |
| 2010/0214550 | A1 | 8/2010 | Hulsebos et al. |
| 2012/0008127 | A1 | 1/2012 | Tel et al. |
| 2017/0023491 | A1 | 1/2017 | Cao et al. |
| 2020/0051235 | A1 | 2/2020 | Majumdar et al. |
| 2020/0401052 | A1* | 12/2020 | Weijden ................ H01L 22/20 |
| 2021/0255548 | A1 | 8/2021 | Vellanki et al. |
| 2021/0364929 | A1* | 11/2021 | Hsu ........................ G03F 7/7055 |
| 2022/0082949 | A1* | 3/2022 | Hubaux ............... G03F 7/70491 |
| 2022/0196580 | A1* | 6/2022 | Yin ....................... G03F 7/7065 |
| 2022/0291590 | A1* | 9/2022 | Su ........................... G03F 7/705 |
| 2022/0350254 | A1* | 11/2022 | Pisarenco ............... G03F 7/705 |
| 2022/0404712 | A1* | 12/2022 | Zhang ................. G03F 7/70616 |
| 2023/0059313 | A1* | 2/2023 | Maher ...................... G06N 3/09 |
| 2023/0076185 | A1* | 3/2023 | Larranaga ........ G05B 19/41875 |
| 2023/0185183 | A1* | 6/2023 | Hu ....................... G03F 7/70683 |
| | | | 430/5 |

FOREIGN PATENT DOCUMENTS

| | | |
|---|---|---|
| WO | 2011081645 | 7/2011 |
| WO | 2015101458 | 7/2015 |
| WO | 2016128189 | 8/2016 |
| WO | 2017067748 | 4/2017 |
| WO | 2017117568 | 7/2017 |
| WO | 2018133999 | 7/2018 |
| WO | 2019191319 | 10/2019 |
| WO | 2020156769 | 8/2020 |

OTHER PUBLICATIONS

Chinese Office Action issued in corresponding Chinese Patent Application No. 110109257, dated Mar. 17, 2022.

* cited by examiner

METHOD FOR DETERMINING AN INSPECTION STRATEGY FOR A GROUP OF SUBSTRATES IN A SEMICONDUCTOR MANUFACTURING PROCESS

CROSS-REFERENCE TO RELATED APPLICATIONS

This application is the U.S. national phase entry of PCT Patent Application No. PCT/EP2021/054988 which was filed on Mar. 1, 2021, which is based upon and claims the benefit of priority of European Patent Application No. 20167648.3 which was filed on Apr. 2, 2020, European Patent Application No. 20174335.8 which was filed on May 13, 2020, and European Patent Application No. 20198754.2 which was filed on Sep. 28, 2020, each of which is incorporated herein in its entirety by reference.

FIELD

The present invention relates to semiconductor manufacturing processes, in particular methods to make a decision, such as whether a substrate should be inspected, in a semiconductor manufacturing process.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda / NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

These tight control loops are generally based on metrology data obtained using a metrology tool measuring characteristics of the applied pattern or of metrology targets representing the applied pattern. In general the metrology tool is based on optical measurement of the position and/or dimensions of the pattern and/or targets. It is intrinsically assumed that these optical measurements are representative for a quality of the process of manufacturing of the integrated circuits.

In addition to control based on optical measurements, also e-beam based measurements may be performed; among which a so-called low voltage measurement using an e-beam tool (as offered by HMI) may be utilized. Such a low voltage contrast measurement is indicative of the quality of electrical contact between layers applied to the substrate.

Any metrology or inspection takes significant time and therefore only a fraction of processed wafers can be inspected in a practical system. The overall benefit to the process of inspection of different wafers will vary from wafer to wafer. As such, an improved method for making decisions such as which wafers should be inspected is desired.

SUMMARY

It is an object of the inventors to address the mentioned disadvantages of the state of the art.

In a first aspect of the invention there is provided a method for determining an inspection strategy for at least one substrate, the method comprising: quantifying, using a prediction model, a compliance metric value for a compliance metric relating to a prediction of compliance with a quality requirement based on one or both of pre-processing data associated with the substrate and any available post-processing data associated with the at least one substrate; and deciding on an inspection strategy for said at least one substrate, based on the compliance metric value, an expected cost associated with the inspection strategy and at least one objective value describing an expected value of the inspection strategy in terms of at least one objective relating to the prediction model.

BRIEF DESCRIPTION OF THE DRAWINGS

Embodiments of the invention will now be described, by way of example only, with reference to the accompanying schematic drawings, in which:

FIG. 7 comprises flowcharts of (a) a flowchart of a prediction method of a machine learning model (e.g., neural network) implementation of the second embodiment and (b) a flowchart of the machine learning model implementation of the second embodiment.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. More information on such mirror arrays is given in U.S. Pat. Nos. 5,296,891 and 5,523,193, which are incorporated herein by reference.
- a programmable LCD array. An example of such a construction is given in U.S. Pat. No. 5,229,872, which is incorporated herein by reference.

Figure 1:
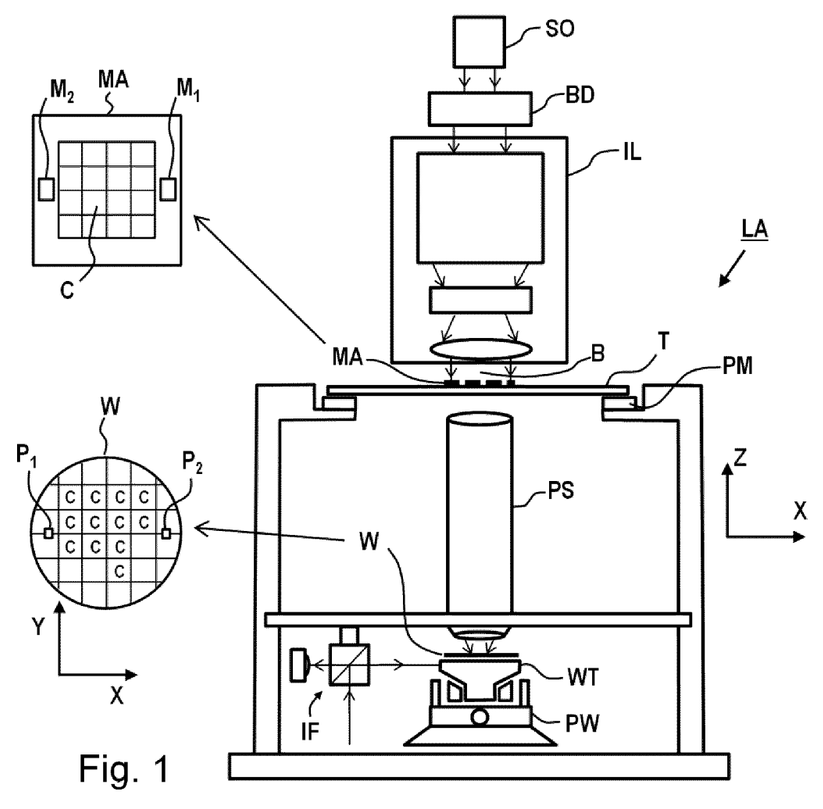
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support structure (e.g., a mask table) MT constructed to support a patterning device (e.g., a mask) MA and connected to a first positioner PM configured to accurately position the patterning device MA in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illuminator IL receives a radiation beam from a radiation source SO, e.g. via a beam delivery system BD. The illumination system IL may include various types of optical components, such as refractive, reflective, magnetic, electromagnetic, electrostatic, or other types of optical components, or any combination thereof, for directing, shaping, or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate may be covered by a liquid having a relatively high refractive index, e.g., water, so as to fill a space between the projection system and the substrate—which is also referred to as immersion lithography. More information on immersion techniques is given in U.S. Pat. No. 6,952,253 and in PCT publication No. WO99-49504, which are incorporated herein by reference.

The lithographic apparatus LA may also be of a type having two (dual stage) or more substrate tables WT and, for example, two or more support structure MT (not shown). In such "multiple stage" machines the additional tables/structures may be used in parallel, or preparatory steps may be carried out on one or more tables while one or more other tables are being used for exposing the design layout of the patterning device MA onto the substrate W.

In operation, the radiation beam B is incident on the patterning device (e.g., mask MA), which is held on the support structure (e.g., mask table MT), and is patterned by the patterning device MA. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and possibly another position sensor (which is not explicitly depicted in FIG. 1) may be used to accurately position the mask MA with respect to the path of the radiation beam B. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Figure 2:
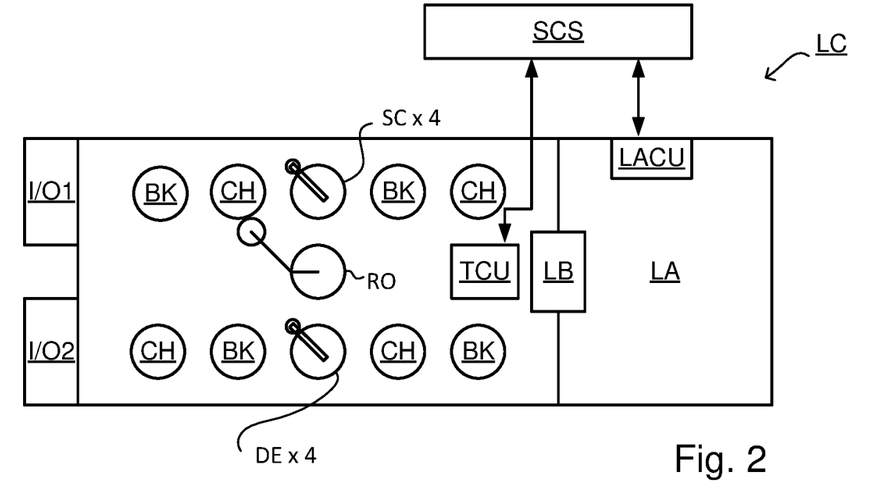
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
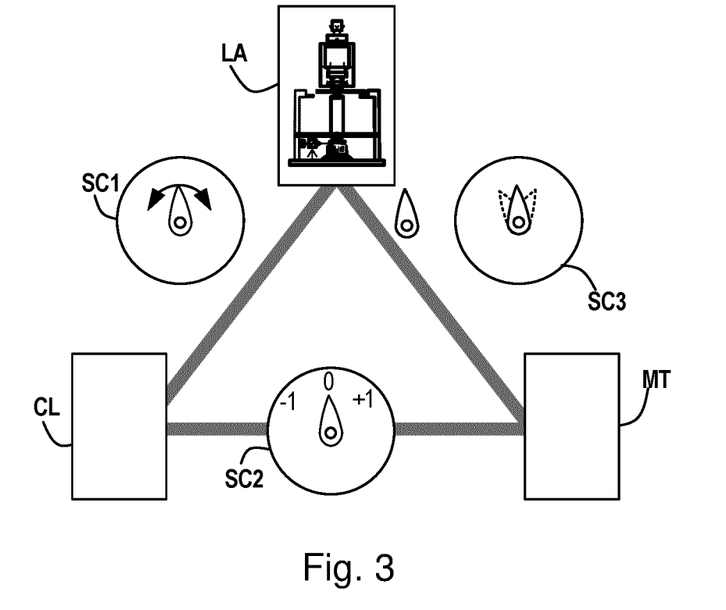
FIG. 3 depicts a schematic representation of holistic lithography, representing cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double white arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT), so as to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

The lithographic apparatus LA is configured to accurately reproduce the pattern onto the substrate. The positions and dimensions of the applied features need to be within certain tolerances. Position errors may occur due to an overlay error (often referred to as "overlay"). The overlay is the error in placing a first feature during a first exposure relative to a second feature during a second exposure. The lithographic apparatus minimizes the overlay errors by aligning each wafer accurately to a reference prior to patterning. This is done by measuring positions of alignment marks on the substrate using an alignment sensor. More information on the alignment procedure can be found in U.S. Patent Application Publication No. US20100214550, which is incorporated herein by reference. Pattern dimensioning (e.g., CD) errors may, for example, occur when the substrate is not positioned correctly with respect to a focal plane of the lithographic apparatus. These focal position errors may be associated with un-flatness of a substrate surface. The lithographic apparatus minimizes these focal positon errors by measuring the substrate surface topography prior to patterning using a level sensor. Substrate height corrections are applied during subsequent patterning to assure correct imaging (focusing) of the patterning device onto the substrate. More information on the level sensor system can be found in U.S. Patent Application Publication No. US20070085991, which is incorporated herein by reference.

Besides the lithographic apparatus LA and the metrology apparatus MT other processing apparatus may be used during IC production as well. An etching station (not shown) processes the substrates after exposure of the pattern into the resist. The etch station transfers the pattern from the resist into one or more layers underlying the resist layer. Typically etching is based on application of a plasma medium. Local etching characteristics may, for example, be controlled using temperature control of the substrate or directing the plasma medium using a voltage controlled ring. More information on etching control can be found in international Patent Application Publication No. WO2011081645 and U.S. Patent Application Publication No. US 20060016561 which are incorporated herein by reference.

During the manufacturing of the ICs, it is of great importance that the process conditions for processing substrates using processing apparatus, such as the lithographic apparatus or etching station, remain stable such that properties of the features remain within certain control limits. Stability of the process is of particular importance for features of the functional parts of the IC, i.e., the product features. To guarantee stable processing, process control capabilities need to be in place. Process control involves monitoring of processing data and implementation of means for process correction, e.g. control the processing apparatus based on characteristics of the processing data. Process control may be based on periodic measurement by the metrology apparatus MT, often referred to as "Advanced Process Control" (further also referenced to as APC). More information on APC can be found in U.S. Patent Application Publication No. US20120008127, which is incorporated herein by reference. A typical APC implementation involves periodic measurements on metrology features on the substrates to monitor and correct drifts associated with one or more processing apparatus. The metrology features reflect the response to process variations of the product features. The sensitivity of the metrology features to process variations may be different compared to the sensitivity of the product features. In that case, a so-called "Metrology To Device" offset (further also referenced to as MTD) may be determined. To mimic the behavior of product features, the metrology targets may incorporate segmented features, assist features or features with a particular geometry and/or dimension. A carefully designed metrology target should respond in a similar fashion to process variations as the product features. More information on metrology target design can be found in international Patent Application Publication No. WO 2015101458 which is incorporated herein by reference.

The term fingerprint may refer to a main (systematic) contributor ("latent factor") of a measured signal, and in particular a contributor connected to the performance impact on-wafer or to previous processing steps. Such a fingerprint can refer to substrate (grid) patterns (e.g. from alignment, leveling, overlay, focus, CD), field patterns (e.g., from intrafield alignment, leveling, overlay, focus, CD), substrate zone patterns (e.g., outermost radius of wafer measurements) or even patterns in scanner measurements related to wafer exposure (e.g., heating signature through-lot from reticle alignment measurements, temperature/pressure/servo profiles, etc.). Fingerprints may be comprised within a fingerprint collection, and may be encoded homogenously or heterogeneously therein.

Electrical measurement data is typically obtained after processing of substrates. Typically, when performing electrical metrology to obtain the electrical measurement data, all the dies on the substrates are measured using probes which make (near) contact to the circuits formed during the processing. Various types of measurements may be performed; voltage, current, resistance, capacitance and inductance measurements, for example. These measurements may be performed under different conditions (frequencies, voltage, current for example) and at a plurality of locations across the die. The electrical measurement may comprise an evaluation of whether a particular structure/feature or device is functional (e.g., within specification). Alternatively, or in addition, the electrical measurement may be categorized according to "bin codes". An electrical measurement associated with a certain measured parameter (current, voltage, resistance, capacitance, inductance) at a certain condition is commonly referred to as a separate "bin code". Hence a typical electrical measurement across a die may be represented by a plurality of graphs, each graph representing a spatial distribution of values associated with a particular bin code. Throughout the text, "bin code" and "electrical characteristic" is used synonymously such that a value of a bin code associated with the substrate is referred to as a value of an electrical characteristic of the substrate. Electrical measurement data may also comprise bit asymmetry data or any other yield parameter.

The properties (minimum value, maximum value, variance or any other statistical measure) of the measured electrical characteristics are important indicators regarding the probability that a certain circuit on a die will be functional. Hence a strong relationship exists between the electrical characteristic and the yield of the process. Hence for yield control, electrical characteristic measurements are indispensable. However, they are also time consuming and are only performed at the end stage of the semiconductor manufacturing process (e.g. when options for correcting non-functional circuits are virtually absent).

Deciding which substrates should be inspected and/or reworked after exposure is an important consideration which will have an impact on throughput and yield. Errors in classification will result in yield wastage, as undetected out-of-speciation/non-functioning devices will be processed, or else trigger too many false alarms, resulting in unnecessary checks and low efficiency. Rework decisions are based on metrology measurement (inspections) that are both costly and time-consuming. Also, the inspection capacity of a fab is usually limited; e.g., to no more than 5% or 10% of the production volume. As a result, only a small number of all wafers produced are inspected. Typically the vast majority of the inspected wafers are found to be within specification (OK). Rework decisions should take place within a short period of time, usually within few minutes. Inspection in this context may refer to a post-exposure metrology action (e.g., expensive metrology, where the cost may be measured in terms of time) such as measurement by a scatterometry apparatus or a scanning electron microscope apparatus (e.g., an e-beam apparatus), for example.

Currently, there are different selection strategies to decide which wafers should be inspected. These strategies include random selection or fixed selection (e.g., the nth wafer of each lot). Another strategy may be selection based on measurements and experience. A subject-matter expert (SME) decides whether a wafer should be inspected based on custom-KPI (key performance indicator) values and their experience. Such strategies may be implemented singularly or in any combination.

Random or fixed selection strategies might result in a needlessly high engineering operating expense (OPEX). This is because the wafers are not inspected based on quality-related measurements. At the same time, these strategies cannot prevent yield loss as the selection criteria are not designed to inspect abnormal wafers. For the expert based strategy, the SME is likely to introduce high variance and biases in the rework decision. As a consequence, a systematic and reliable rework-decision-process is not likely. Depending on the bias, this strategy can result in large Type I (false positive) or Type II (false negative) errors, leading to high OPEX or yield loss, respectively In addition to the strategies described, published application WO2018133999 (incorporated herein by reference) describes a method which facilitates the assessment of wafers by the use of a utility model that is trained to learn the mapping between pre-processing wafer data (e.g., context data) with wafer/device performance, e.g., yield. Pre-processing data or context data may describe which tool or combination of tools were used in processing the wafer, and/or comprise scanner metrology data such as alignment and leveling data. This pre-processing wafer data may be considered "cheap" metrology data, or essentially free as it is performed for each wafer in any case, compared to the cost of post-processing metrology. The output of this utility model is used by a semi-supervised algorithm that makes performance predictions based on fab and litho context-data. All wafers are visualized then to the SME by using data transformation and clustering techniques. Performance of the wafers is predicted by either the utility model or the semi-supervised algorithm; labeled wafers which belong to one or more of these clusters provide an indication of the performance of unlabeled wafers which belong to same clusters. The SME then makes a decision to inspect a wafer based on the visualization.

As semi-conductor factories evolve, a timely inspection decision becomes a constraint. Where decisions use expert input, the SME cannot discover patterns leading to identification of potential not-OK (NOK) root-causes, due to the volume of data/KPI they have to analyze. In addition, the expert cannot inspect and analyze such large amount of data in the given time, even if provided with a visualization tool such as described in WO2018133999. While this method provides the SME with a cluster visualization, it is not automated in the sense that all rework decisions still depend on the expert.

It is proposed to use a machine learning strategy for prediction of wafer quality (e.g., rework decision) based on available per-wafer data (e.g., pre-processing data). Either supervised or unsupervised predictors or prediction algorithms can be chosen to derive a yield-related prediction; e.g., a prediction of a wafer being either NOK or OK. Additionally, an associated probability value of the wafer being NOK/OK may be provided.

Based on the probability, one or more other objectives and the metrology cost, one or more wafers may be selected for inspection. These objectives may relate to the value (e.g., in terms of one or more informativity metrics) of obtaining metrology data for one or more of: a) verifying whether a wafer is correctly characterized (accuracy of the model), b) accelerating learning process (maturity of the model), c) discovering new patterns; e.g., OK/NOK patterns (scope of the model) and d) selecting proper wafers for APC feedback loop. The framework balances these objectives in view of the estimated final yield against the cost of metrology (OPEX). The relative importance of the objectives and cost may be configurable to achieve a flexible framework of rework prediction and wafer selection.

Figure 4:
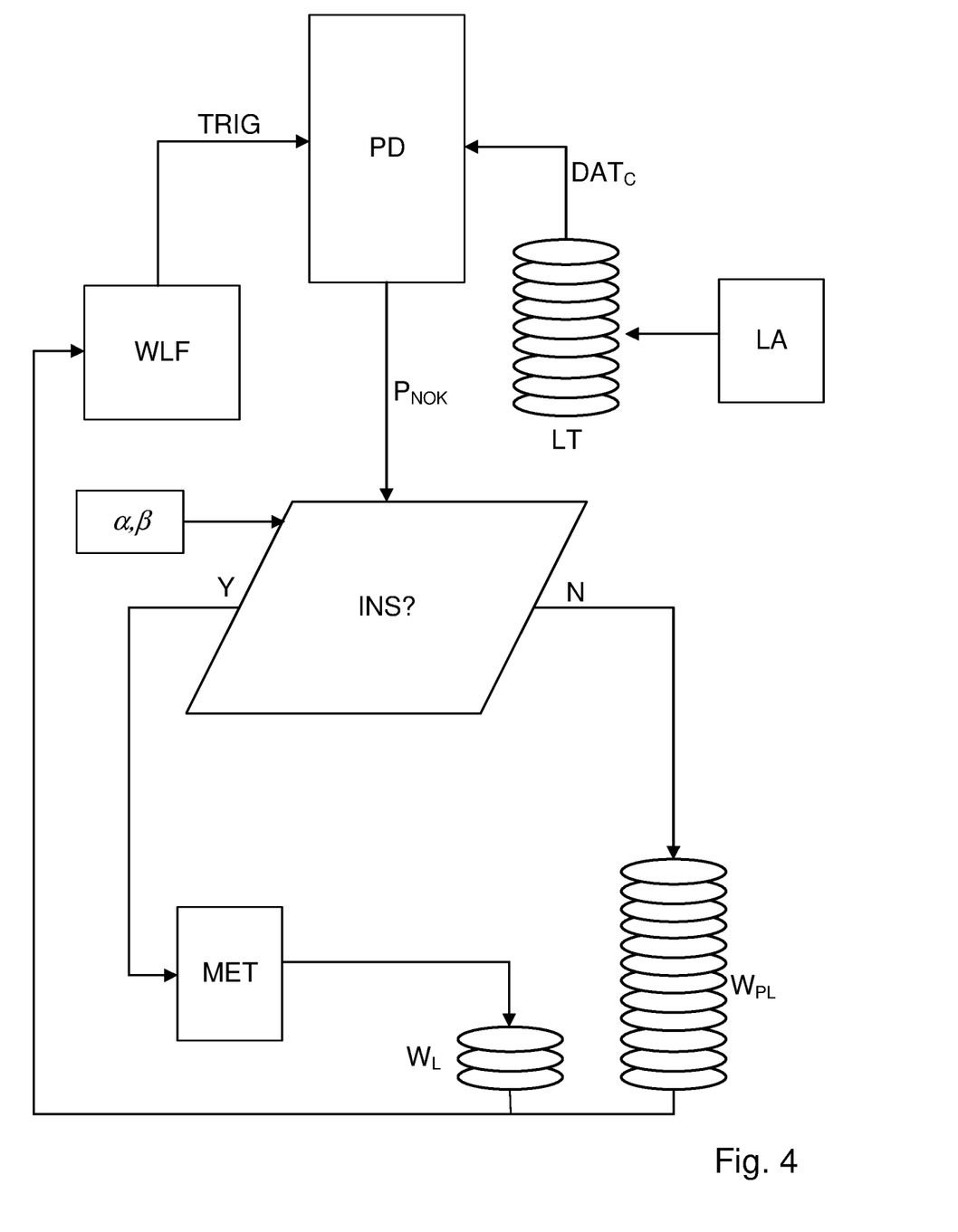
FIG. 4 is a flowchart of a decision making method according to a first embodiment of the invention.

FIG. 4 is a flowchart describing an example of a method according to an embodiment. In this embodiment, a machine learning strategy predicts whether each instance (e.g., each wafer) is OK or NOK. This strategy leverages active learning to cope with the twin challenges of small labeled datasets (as few wafers are inspected) and imbalanced datasets in terms of OK vs NOK wafers (as there are typically very few defective wafers). In an embodiment, the strategy is not static and may be tuned on demand and/or evolve over time. In this way, it may holistically improve the overall performance (for example a classification or performance metric such as ROC AUC (receiver-operating characteristic area under curve)) while minimizing wafer yield loss and customer engineering OPEX.

The method embeds a predictor PD or prediction algorithm and may quantify prediction uncertainty to optimize decision making on which wafers to inspect. Wafers may be optimally selected for inspection with the two-fold aim of accelerating the learning of the embedded predictor PD and/or discovering new OK/NOK patterns. The embedded predictor PD may be either supervised or unsupervised, or even a combination of the two.

A lithographic apparatus LA or scanner processes a group of wafers or wafer lot LT. Pre-processing data or context data (e.g., describing processing history and/or comprising scanner metrology data) for each wafer of the wafer lot LT is passed to the predictor PD (e.g., a machine learned/machine learning model) which outputs a probability value $P_{NOK}$ describing the probability of each wafer being defective. Based on the probability value $P_{NOK}$, a decision INS? as to whether the wafer should be inspected is made. This decision may be configurable, e.g., via tuning/selecting parameters $\alpha$, $\beta$ of a beta function used in making the decision. This will be described in more detail below. Those (few) wafers sent for inspection are inspected MET using a suitable metrology tool, with the measurement data (e.g., confirmation of OK/NOK status) used to label the wafers $W_L$. Those not inspected are labeled by a category (e.g., OK/NOK) based on the probability value $P_{NOK}$ assigned by the predictor PD (e.g., by comparing this value to a threshold indicative of non-functionality). For example, instances for which such probability is above a certain threshold, may be labeled as 'NOK'; instances for which such probability is below that threshold, may be labeled as 'OK'. This step has the purpose of building a set of pseudo-labeled wafers $W_{PL}$ for retraining.

With regard to the model used by the predictor PD, highly imbalanced datasets may use a suitable unsupervised machine learning model. For example, an autoencoder architecture may be used, which is trained only on the dominant/majority class (e.g., OK wafers). For example, the dominant/majority class may correspond to what can be described as normal behavior, with the autoencoder trained using only data which falls in this class. In this way, it will learn the underlying representations of the normal class and will efficiently reconstruct examples which belong to it with a low reconstruction error (or other uncertainty metric). The autoencoder will not be able to capture the underlying structure of a class never observed before and will be unable to reconstruct instances belonging to it, resulting in a high reconstruction error. In this way, instances that do not belong to the majority class can be detected, since the autoencoder is not expected to efficiently reconstruct them, acting as an anomaly detector. In addition, the reconstruction error may be mapped onto a probability of the instance being NOK; for example by means of either a parametric model (like an exponential law) or a non-parametric model (e.g. Kernel Density Estimation).

In the case of more balanced datasets, a supervised predictor PD may instead be adopted. The output of the supervised algorithm may be the probability of each instance being NOK; support for probability prediction may be added to the algorithm if needed.

The inspection capacity of a fab is typically limited to a fraction of the production and inspections are costly. This fact has implications on the size of the dataset usually available and the rate at which it can be enriched, ultimately impacting the speed at which a prediction method can be fully learned from scratch or from a small initial dataset.

A decision INS? on which wafers to inspect may be taken by solving an optimization problem with respect to the probability value $P_{NOK}$, with the constraint that the fab capacity inspection is not exceeded. The objective function may incorporate at least the following contributions:

individual-wafer inspection-value (e.g., a first objective value) with respect to checking that the prediction-accuracy is in spec (e.g., a first objective);

individual-wafer inspection-value (e.g., a second objective value) with respect to accelerating the learning process (e.g., a second objective);

individual-wafer inspection-value (e.g., a third objective value) with respect to discovering new OK/NOK patterns (e.g., a third objective);

cost of exceeding the nominal inspection capacity with respect to the amount of wafers inspected up to the decision time.

The aforementioned published application WO2018133999, for example, describes a general framework for controlling measurements to be performed based on their (expected) informativeness.

An example of a suitable objective function to be minimized may be:

$$f(\xi; \pi) = \left\langle -\frac{\pi^\alpha (1-\pi)^\beta}{B(\alpha, \beta)} + \gamma_t, \xi \right\rangle$$

where:
the brackets denote scalar product;
$\xi \in \{0, 1\}^{25}$ expressing that ith wafer selected if and only if $\xi_i = 1$;
$\pi \in [0, 1]^{25}$ is the vector of estimated NOK probabilities;

$B(\alpha, \beta) = \frac{\Gamma(\alpha)\Gamma(\beta)}{\Gamma(\alpha+\beta)}$ is the beta function of parameters $\alpha$, $\beta$;

$\gamma_t$ is a parameter which constrains the solution to prevent having too many wafers selected.

The scalar product serves the purpose of forming indicators $\xi_i$ (i=1, 2, . . . , 25) weighted by the coefficient $$-\frac{\pi_i^\alpha (1-\pi_i)^\beta}{B(\alpha,\beta)} + \gamma_{i,t}.$$

The contribution to the objective function of selecting a wafer is a positive uniform cost linked to the wafer-inspection capabilities less a cost which depends on the value of inspecting that specific wafer.

The parameters $\alpha$ and $\beta$ determine the re-weighing based on a transformation of the interval [0, 1], where the estimated NOK probabilities live. When $\alpha=\beta$, equal weight is put on the regions $P_{NOK}<\frac{1}{2}$ and $P_{NOK}>\frac{1}{2}$, with the extremal values (around 0 and 1) being weighed more (resp. less) if $\alpha=\beta>1$ (resp. $\alpha=\beta<1$). If more weight is put on wafers for which $P_{NOK}\approx 0.5$, learning will accelerate; if more weight is put on wafers for which $|P_{NOK}-0.5|>>0$, focus will shift on production control and discovery of new failure modes. Re-weighing in a non-symmetric way (e.g. more weight to wafers for which $P_{NOK}\approx 1$ than $P_{NOK}\approx 0$) is also possible by choosing appropriate values of $E\neq\beta$. As such, a bias can be imposed towards any corresponding quantiles of the probability of the substrate complying with a quality requirement.

The $\alpha$, $\beta$ pair may be set according to one or more of the following methods. A first method may rely on having a set of predefined $\alpha$, $\beta$ pairs, each one addressing a specific aim. For example, specific $\alpha$, $\beta$ pairs may include pairs which:
  i) improve the performance of the algorithm by selecting wafers for inspection which cannot be easily classified;
  ii) improve a desired metric such as AUC;
  iii) detect as many bad wafers as possible.

A second method relies on Reinforcement Learning. The Reinforcement Learning Agent aims to tune the pair of the $\alpha$, $\beta$ parameters, considering the following Reinforcement Learning setting:
  State: Corresponds to the predicted probability of each wafer to be NOK and to the current combination of $\alpha$, $\beta$.
  Action: Adjust $\alpha$, $\beta$ and decide which wafers should be inspected.
  Reward: the improvement of a performance metric of the classification algorithm. The reward may also be based on any costs related to a metrology tool sitting idle because the agent is not sending wafers to inspect.

The parameter $\gamma_t$ prevents there being too many selected wafers in the optimal solution. The subscript t indicates that the parameter may vary over time. For example, while the aforesaid exemplary 5% inspection capacity translates to roughly 1 wafer per lot, the system can decide not to inspect any wafers in a lot and instead inspect more wafers in a later lot. The optimal selection of N wafers to be inspected (with N not necessarily 1) is a very challenging task for existing methods which rely on expert decision. Besides the aforementioned potential bias, the choice is combinatorically complex for a human: picking only 2 wafers from a lot requires a comparison of 300 candidate wafer pairs. In addition, the automated inspection decision performed by the proposed machine learning strategy is superior for time-constrained decisions (such as needs to be taken in a fab after exposing a lot) because no human factor is in the loop. The advantage of this formulation is that the relative weights of these contributions in the objective function can be altered on demand, giving freedom for a user to build their own customized product. The presence of the parameter $\gamma_t$ term in the objective function enables the inspection capacity to be handled dynamically.

In an embodiment, there may be periodic retraining to improve the performance of the machine learning strategy and/or to learn new OK/NOK patterns. The machine learning strategy contributes to the enlargement/creation of two datasets: one containing labeled OK/NOK wafers $W_L$ and the other containing predicted OK/NOK wafers $W_{PL}$. The retraining is done on these periodically-enlarged datasets. This retraining is signified in FIG. 4 by the feedback loop from the labeled $W_L$ and pseudo-labeled wafers $W_{PL}$ to a weighted loss function WLF which assesses the performance of the prediction based on the actual labeled wafers $W_L$. Should this performance not meet a threshold for acceptability, a trigger TRIG may be generated to trigger retraining of the predictor PD. In addition, the loss function WLF may be adapted in order to focus on understanding the most recent patterns in the data or to account for the uncertainty of the predicted pseudo-labels.

The nature of a semiconductor manufacturing process leads to data evolving over time, generating changes in the underlying data distribution. This scenario, where the distribution of features and labels p(X,y) is not stationary but drift from time to time is known as concept drift. A number of scenarios illustrating this will now be presented:

When a new unseen substrate is exposed, the objective function can adapt automatically by reverting to an initial setup. For example, if it is deemed important to accelerate the learning process (i.e., described with the contributor: individual-wafer inspection-value with respect to accelerating the learning process) for unseen wafers, as soon as a new substrate is identified, the weight for this contributor may be increased using the substrate ID from the scanner data.

In another example, concept drift e.g., due to a change in the underlying data distribution (which may be as a result of changes in the process or scanner natural behavior) may be addressed by monitoring the performance of the predictor PD. Some of the true labels (inspected wafers $W_L$) are available after the predictions are made, which can trigger a periodic retraining step in order to provide an up-to-date model. A prediction performance delta may be quantified to provide a measure of the magnitude of the data distribution change. Based on this prediction performance delta, the objective function's contributors may be varied/adapted: e.g., the larger the drop in performance, the more the weights may be varied towards an initial setup, as this is indicative of a new initial state with a new data distribution. The parameters $\alpha$ and $\beta$ may be maintained proportionally with the prediction performance (e.g. a classification or performance metric such as AUC): e.g., the better the performance, the more focus on selecting only NOK wafers. The classification model retraining may be triggered TRIG when the prediction performance is lower than a (e.g., customized) performance threshold.

A further embodiment for metrology control based on weighting/balancing of the value of metrology data (for improving yield prediction) and cost of metrology data (measurement time) will now be described. Such a method may be a refinement of the method described above or a separate embodiment. This embodiment may include a multi-layer aspect and is not limited to decisions as to whether whole substrates are to be measured; instead a decision may include deciding whether to measure a particular target or mark, or group thereof (e.g., on an incremental basis), and/or to decide which targets of a substrate may be measured (e.g., decide on a sampling scheme or sampling strategy).

The embodiment may use a measurement collector model to decide on wafer and/or target selection for measurement, e.g., so as to minimize the number of (expensive) metrology actions while maintain a sufficiently accurate (final) yield prediction. Note also that the previously described embodiment may also use such a measurement collector model. The collector model may, for example, evaluate the current state of the metrology data measured to date, other pre-processing wafer data (for example context data) and/or yield prediction data and scores the state according to the quality of yield prediction based on existing data. The collector model may be trained to evaluate which additional data (state transition) provides a largest gain in yield prediction accuracy. The data acquisition can end if the yield prediction quality meets a requirement, for example.

As before, a Machine Learning approach is proposed for the acquisition of costly measurements (e.g., after-develop inspection (ADI) and/or after-etch/after-clean inspection (AEI/ACI)) of a parameter of interest (for example, overlay and/or CD) at each layer, such that the acquired measurements optimally allow prediction of yield in a cost effective way. This may comprise identifying and performing, for each layer, only those costly measurements which are deemed to improve yield predictions significantly. This setup is an active feature acquisition on prediction time. The solution works online and provides advice on measurement acquisition for each layer as a wafer is being processed.

Figure 5:
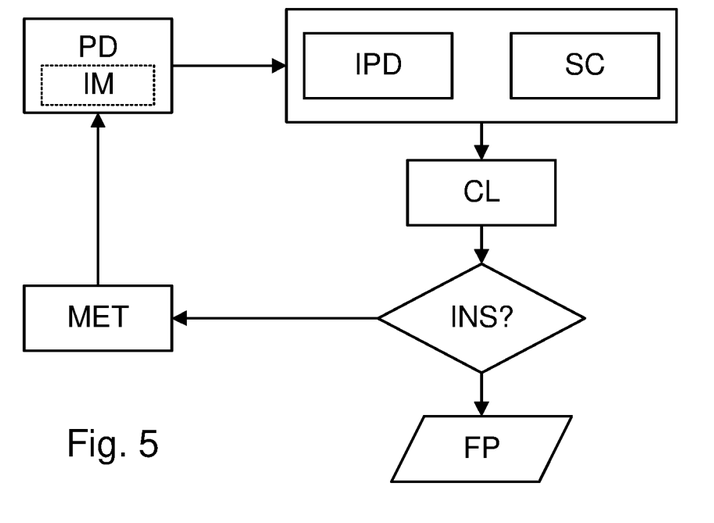
FIG. 5 is a flowchart of a decision making method according to a second embodiment of the invention.

FIG. 5 is a flow diagram illustrating the interaction between the two main components, a yield predictor PD and a measurement collector CL, according to such an embodiment. Furthermore, the yield predictor PD may optionally comprise an imputer IM to perform imputation for missing or sparse data.

The yield correlator/predictor PD may comprise a model for predicting yield through stack. Such a model may use pre-processing wafer data (for example alignment, leveling and context data), which is cheap and available for all wafers, and any expensive metrology data which may have been acquired from selected wafers at each layer to predict yield. The predicted yield may be optimized to closely reflect the actual yield, while using as little expensive metrology MET as possible. Additionally, this model may update its yield prediction PD as a wafer is being processed in consecutive layers and new data becomes available incrementally. Therefore, the yield predictor may output, per wafer, a number of intermediate yield predictions IPD based on partial information from expensive data as each wafer is being processed and additional measurements are made and added. The last of these intermediate yield predictions IPD becomes the final yield prediction; e.g., when the intermediate yield prediction IPD is deemed to be sufficiently accurate, e.g., according to a suitable metric such as acquisition score SC.

The yield predictor PD may also comprise an imputer IM. The imputer is an optional component which improves practicality by deriving missing expensive measurements of non-critical layers from existing measurement data, obviating the need to work with missing data or stopping measurement acquisitions prematurely due to limited resources.

The measurement collector CL may receive a state as an input and decide on an inspection decision INS?. The state summarizes the information or data DATc collected so far, e.g., all expensive metrology data collected, all relevant context data (and other cheap metrology data) and any previous predictions. When using an imputer, this state may be expanded with the imputed values (imputed metrology data). Its output is an action to take next. The possible actions may comprise 1) acquire more information, i.e., perform a further inspection action MET to obtain one or more additional expensive measurements; or 2) stop and output the current prediction as the final prediction FP. The measurement collector CL is a decision making function (i.e., prompting decision INS?). It learns when to acquire more information according to some criteria of the acquisition score SC.

The aim may be to obtain the most confident yield prediction for a wafer, while incurring the minimum cost in terms of inspection or information acquisition. The acquisition score SC may be a function which summarizes the criteria for information acquisition into one numerical value per state transition (e.g., between successive acquisitions, each acquisition changing the state). This acquisition score SC may be used by the measurement collector CL as a basis for the decision INS? as to acquire more information.

By way of example, the acquisition criteria may include:
Quality of intermediate yield prediction IPD. Additional expensive information (e.g., one or more additional metrology steps) should be performed for a wafer if the yield predictor PD cannot make a confident prediction (e.g., according to a confidence metric) based on the current state (e.g., already acquired information and imputed values). Overall, the aim is to minimize prediction uncertainty, but not at too great a cost.
Cost of information acquisition. The acquisition of expensive measurements is costly. This cost may vary from layer to layer, and/or may vary depending on the measurement type e.g., whether it comprises ADI overlay, ACI overlay, or CD measurements. Therefore the quality and confidence should be balanced against this cost; e.g., so as to balance maximizing confidence in the yield prediction and minimizing the cost of information acquisition.
Expected utility and highest information gain (optional). It is also possible to acquire expensive measurements for learning purposes only. Namely, measurements may be acquired which improve the yield predictor PD and the measurement collector CL.

The proposed scheme can be implemented with different machine learning methods. A first examples will be described which uses a reinforcement learning framework and with a second example which uses a more conventional machine learning technique.

Figure 6:
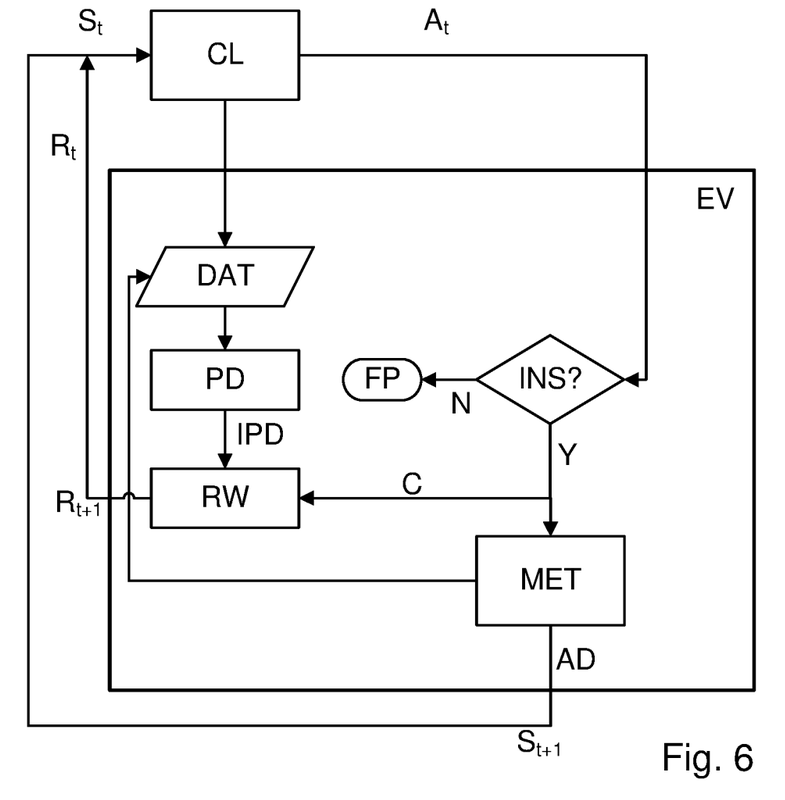
FIG. 6 is a flowchart of a reinforcement learning implementation of the second embodiment.

The proposed arrangement may be naturally implemented within a reinforcement learning framework. FIG. 6 illustrates such a framework. In this arrangement, a Markov decision process (MDP) may be defined, comprising an agent (e.g., the measurement collector CL) in the environment EV, a set of states and a set of actions per state. In state $S_t$, the agent CL chooses the action $A_t$ according to a policy. When the agent CL decides INS? on a state change, a reward RW is generated and the updated reward value $R_{t+1}$ (updated with respect to the previous reward $R_t$) is received by the agent CL for the next iteration. The goal of the agent CL is to maximize its total reward RW.

The agent, which determines the decision making process INS? on information acquisition, may correspond to the measurement collector CL of FIG. 5. As already described, the possible actions the agent CL may choose are 1) perform an inspection action MET i.e., expensive measurements to acquire additional data AD associated with an updated state $S_{t+1}$, or 2) stop and output the current prediction FP.

The state comprises all the information collected so far, the importance of the non-acquired features can be estimated from the already acquired features and the yield predictor PD.

The environment EV consists of all possible states in the system and all state transitions. The environment EV interacts with the agent CL providing state updates and rewards RW. The reward RW corresponds to the acquisition score. The final reward RW may be a function of the confidence of the yield prediction IPD and the cost C of the acquired expensive information. At each state, a negative reward C is incurred when acquiring expensive measurements. In this way, a trade-off between optimizing yield prediction and minimizing the acquired information can be achieved.

The agent CL may learn an optimal policy for information acquisition. To learn the optimal policy, any state-of-the art regression learning algorithms may be used to learn the optimal policy, for example Q-learning. The policy can be trained simultaneously with training of the yield predictor and the imputer.

Figure 7:
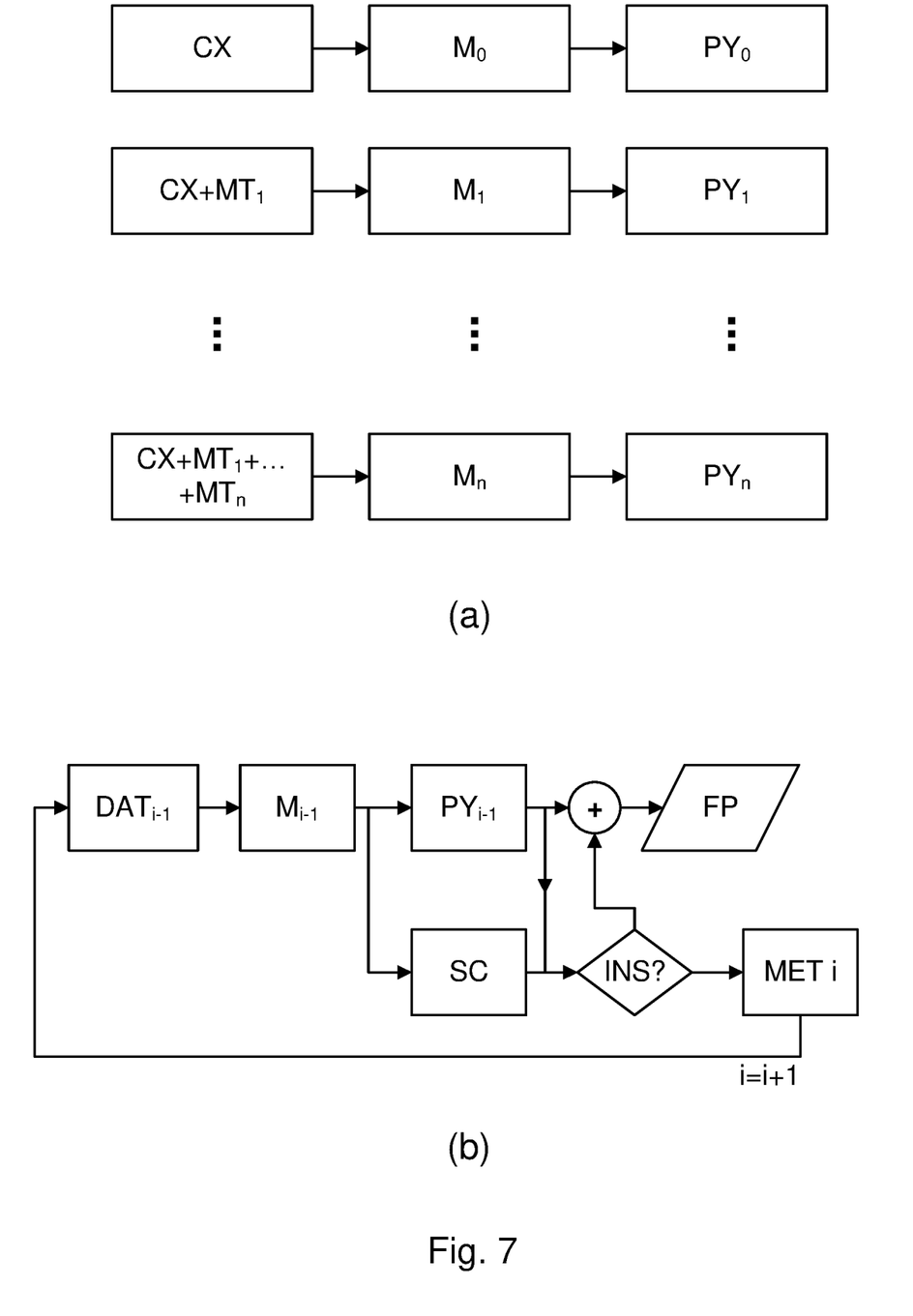

FIG. 7 illustrates a further embodiment based on other machine learning principles. FIG. 7(a) illustrates an implementation of a yield predictor as a succession of models such that a base model $M_0$ predicts yield $PY_0$ using only cheap context data CX (e.g., of the zero layer) and each additional model $M_i$ additionally incorporates costly measurements $MT_i$ of layer i (where i=0 to n) to predict yield $PY_i$. In this way the yield predictor through stack may comprise a cascade of models, $M_0$ to $M_n$. At each layer i for each wafer, the model $M_i$ may be used to predict yield and based on this acquisition score, a decision to acquire expensive measurements $MT_i$ may be made. If the metrology resources in a fab are fixed, the wafer measurements having the highest acquisition scores may be selected for acquiring the corresponding expensive measurements. In a more flexible setting, a costly measurement for a wafer can be acquired when the acquisition score is higher than a threshold.

FIG. 7(b) illustrates a framework for a yield predictor arrangement such as illustrated in FIG. 7(a). During exposure of consecutive layers 0, 1, 2, . . . n, a prediction for each wafer instance is successively determined by models $M_0$, $M_1$, $M_2$ . . . $M_n$ until its prediction is sufficiently confident, at which point it may be decided that no further measurements are required for that wafer. Therefore, for example, during the exposure of layer i, a wafer is modeled using model $M_i$ if model $M_{i-1}$ was not confident enough; e.g., based on a comparison of a confidence metric to a confidence threshold. The cost may also be minimized with respect to the confidence threshold. As such, additional measurements are acquired for the new exposures only as required.

In FIG. 7(b), the active acquisition of costly measurements at prediction time of layer i is determined. All previous data $DAT_{i-1}$ relating to all layers up to and including the preceding layer i−1 is inputted into the predictive model $M_{i-1}$. which outputs a predicted yield $PY_{i-1}$ and corresponding acquisition score SC. The decision INS? as to whether to acquire more information is made by the measurement collector. The decision may assess whether the predicted yield $PY_{i-1}$ meets one or more prediction criteria. If so, the final prediction FP is outputted and the process ends. Otherwise metrology MET i is performed om layer i and the process repeated for the next layer.

An imputer can be optionally used and it is a part of yield predictor (for any of the embodiments described herein). An imputer at layer i, may be used to attempt imputation of expensive measurements for that wafer. The imputer may perform a simple rule-based filling (e.g., extrapolation and/or interpolation) of missing values, or may comprise another predictive machine learning model or a generative model. In this case, the acquisition scores may be computed based on the confidence of that imputation and its impact on yield prediction. The imputer can be co-trained with yield predictor.

The collector and yield predictor may be co-trained; e.g., the first neural network layers of a collector agent and yield predictor may be common and trained together. The model framework is transferable to other products, such that there is no need to start from scratch for each product.

In summary, therefore, a decision making framework is described which decreases engineering OPEX by optimizing inspection decision making based on cost and constrained to fab capacity. The yield loss is expected to decrease since the rework decision is based anomalies detected by the proposed machine learning strategy. Additionally, control may be more stable. The machine learning strategy is able to deal with both small and/or imbalanced datasets, which is a normal scenario in the lithography industry. The proposed strategy provides a well performing OK/NOK predictor faster than any existing solution. The proposed approach delivers consistently faster recommendations than an expert, something that is desirable in the evolving semiconductor industry. The impact of the human factor (as well as the bias introduced by it) on inspection decisions is diminished since the assessment of wafers is automated and based on machine learning.

The optimization problem is flexible and can be adapted to particular requirements, so it could be used either to achieve a good performance faster or to keep learning from "known" situations. Advances in interpretability of machine learning may also pinpoint the reason why wafers are flagged as OK or NOK and expand the understanding of wafer-quality assessment.

Transfer Learning methods can facilitate fast prototyping and development of machine learning algorithms which require less training data and are capable of supporting rework decisions on new systems. Mutual patterns between OK and NOK wafers exist among many systems which are expected to be captured by the proposed machine learning strategy.

The retraining can be deployed in such a way that the algorithm training focuses more on understanding the structure of recent anomalies compared to anomalies observed in the past. This does not mean that past anomalies cannot be detected going forward, only that the algorithm prioritizes the understanding of recent anomalies compared to anomalies observed long ago. In this way, the system is able to deal with one of the main challenges in the industry: concept drift.

Further embodiments of the invention are disclosed in the list of numbered clauses below:
1. A method for determining an inspection strategy for at least one substrate, the method comprising:
   quantifying, using a prediction model, a compliance metric value for a compliance metric relating to a prediction of compliance with a quality requirement based on one or both of pre-processing data associated with the substrate and any available post-processing data associated with the at least one substrate; and
   deciding on an inspection strategy for said at least one substrate, based on the compliance metric value, an expected cost associated with the inspection strategy and at least one objective value describing an expected value of the inspection strategy in terms of at least one objective relating to the prediction model.
2. A method according to clause 1, wherein said at least one objective comprises at least one of:

monitoring and/or improving performance of the prediction model according to one or more performance metrics;

accelerating learning of the prediction model;

discovering new patterns to be recognized by the prediction model.

3. A method according to clause 1 or 2, wherein said at least one substrate comprises a group of substrates and said compliance metric comprises a probability value describing a probability of complying with a quality requirement; said method further comprises:

assigning a respective probability value to each substrate of the group of substrates using said prediction model based on said pre-processing data associated with the substrate.

4. A method according to clause 3, wherein the step of deciding on an inspection strategy comprises deciding whether to inspect each substrate of said group of substrates.

5. A method according to clause 3 or 4, wherein said deciding step is configurable such that the decision can be configured to:

impose a bias towards corresponding quantiles of the probability of the substrate complying with the quality requirement.

6. A method according to clause 5, wherein said configurability of said deciding step is realized via configurable parameters of an objective function used in said deciding step.

7. A method according to clause 6, wherein said objective function comprises a binary vector indicating which substrates are selected for inspection weighted by a coefficient dependent on said probability value, expected cost and said configurable parameters.

8. A method according to clause 7, wherein the binary vector and weighting is defined for each substrate in the group of substrates.

9. A method according to clause 7 or 8, wherein said deciding step comprises minimizing said objective function for different candidate binary vectors, subject to a constraint based on said expected cost.

10. A method according to clause 9, wherein said constraint imposes a maximum number of substrates which can be inspected over a time period.

11. A method according to clause 9 or 10, wherein said constraint is implemented by a constraint parameter in said weighting.

12. A method according to clause 9, 10 or 11, wherein said constraint is configurable and/or variable over time.

13. A method according to any of clauses 6 to 12, wherein said weighting is dependent on a beta function of said configurable parameters.

14. A method according to any of clauses 6 to 13, wherein a set of said configurable parameters is selected from a plurality of pre-defined sets of said configurable parameters so as to select and/or configure said objective.

15. A method according to any of clauses 6 to 14, comprising using a reinforcement learning agent to tune said configurable parameters to improve a performance metric and/or cost metric of the model.

16. A method according to clause 1 or 2, wherein said compliance metric comprises a confidence metric describing a level of confidence that said prediction is valid.

17. A method according to clause 16 comprising:

iteratively performing one or more metrology actions to obtain additional post-processing data; and updating said prediction based on the additional post-processing data and assessing said confidence metric or related metric;

till one or more criteria for said confidence metric or related metric is satisfied.

18. A method according to clause 17, performed over a plurality of layers of said at least one substrate till said one or more criteria for said confidence metric or related metric is satisfied.

19. A method according to clause 16, 17 or 18, comprising:

determining an acquisition score based on the confidence metric and the cost of additional metrology action; and deciding whether to perform an additional metrology action based on said acquisition score.

20. A method according to clause 19, wherein the acquisition score is additionally based on an expected utility and/or highest information gain of an additional metrology action.

21. A method according to any of clauses 16 to 20, wherein the step of deciding on an inspection strategy is performed by a measurement collector.

22. A method according to clause 21 wherein the prediction model and measurement collector are implemented within a reinforcement learning framework in which said measurement collector acts as the agent.

23. A method according to clause 21 wherein the prediction model and measurement collector are implemented as trained neural networks.

24. A method according to clause 23, where at least some layers of the prediction model and measurement collector have been co-trained.

25. A method according to clause 23 or 24, wherein said prediction model comprises a plurality of models, each relating to a different layer of the at least one substrate.

26. A method according to any preceding clause, wherein the prediction model comprises an imputer operable to perform imputation on said post-processing data.

27. A method according to any preceding clause, wherein said deciding step is configurable such that said at least one objective is configurable and/or selectable.

28. A method according to any preceding clause, further comprising:

labeling selected substrates according to the result of an inspection;

labeling remaining substrates according to said expected value of the inspection strategy assigned thereto; and evaluating performance of said prediction model based on said labeling.

29. A method according to clause 28, further comprising triggering retraining of the prediction model based on the step of evaluating performance.

30. A method according to any preceding clause, wherein the pre-processing data comprises one or both of:

context data describing a processing history of each substrate; and pre-processing metrology data performed prior to an exposure step on each substrate.

31. A method according to clause 30, wherein said pre-processing metrology data comprises one or both of alignment data and leveling data.

32. A method according to any preceding clause, further comprising inspecting said at least one substrate in accordance with the inspection strategy using an inspection tool.

33. A computer program comprising program instructions operable to perform the method of any of clauses 1 to 31, when run on a suitable apparatus.
34. A non-transient computer program carrier comprising the computer program of clause 33.
35. A processing system comprising a processor and a storage device comprising the computer program of clause 33.
36. A lithographic apparatus comprising the processing system of clause 35.
37. A metrology device comprising the processing system of clause 35 and further operable to perform the method of clause 32.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for determining an inspection strategy for at least one substrate, the method comprising:
   quantifying, using a prediction model and based on one or both of pre-processing data associated with the at least one substrate and/or any available post-processing data associated with the at least one substrate, a compliance metric value for a compliance metric relating to a prediction of compliance with a quality requirement; and
   deciding on an inspection strategy for the at least one substrate, based on the compliance metric value, an expected cost associated with the inspection strategy and at least one objective value describing an expected value of the inspection strategy in terms of at least one objective relating to the prediction model.

2. The method as claimed in claim 1, wherein the at least one objective comprises at least one selected from:
   monitoring and/or improving performance of the prediction model according to one or more performance metrics;
   accelerating learning of the prediction model;
   discovering new patterns to be recognized by the prediction model.

3. The method as claimed in claim 1, wherein the at least one substrate comprises a group of substrates, the deciding on an inspection strategy comprises deciding whether to inspect each substrate of the group of substrates, and the compliance metric comprises a probability value describing a probability of complying with the quality requirement.

4. The method as claimed in claim 3, further comprising assigning a respective probability value, using the prediction model, to each substrate of the group of substrates based on its corresponding pre-processing data.

5. The method as claimed in claim 3, wherein the deciding is configurable such that the decision can be configured to impose a bias towards corresponding quantiles of the probability of a substrate complying with the quality requirement.

6. The method as claimed in claim 5, wherein the configurability of the deciding is realized via one or more configurable parameters of an objective function used in the deciding.

7. The method as claimed in claim 6, further comprising using a reinforcement learning agent to tune the one or more configurable parameters to improve a performance metric and/or cost metric of the prediction model.

8. The method as claimed in claim 6, wherein the objective function comprises a binary vector indicating which one or more substrates are selected for inspection weighted by a coefficient dependent on the probability value, expected cost and the one or more configurable parameters and the deciding comprises minimizing the objective function for different candidate binary vectors, subject to a constraint based on the expected cost.

9. The method as claimed in claim 8, wherein the constraint imposes a maximum number of substrates which can be inspected over a time period.

10. The method as claimed in claim 8, wherein the constraint is implemented by a constraint parameter in the weighting.

11. The method as claimed in claim 3, further comprising:
   labeling one or more selected substrates according to a result of an inspection performed on the selected substrates;
   labeling remaining substrates according to the probability value assigned thereto; and
   evaluating performance of the prediction model based on the labeling.

12. The method as claimed in claim 11, further comprising triggering retraining of the prediction model based on the evaluating the performance.

13. The method as claimed in claim 1, wherein the compliance metric comprises a confidence metric describing a level of confidence that the prediction model is valid, and the method further comprises:
   iteratively performing one or more metrology actions to obtain other post-processing data; and
   updating the prediction model based on the other post-processing data and assessing the confidence metric or a related metric until one or more criteria for the confidence metric or related metric is satisfied.

14. The method as claimed in claim 13, further comprising:
   determining an acquisition score based on the confidence metric and a cost of additional metrology action; and
   deciding whether to perform an additional metrology action based on the acquisition score.

15. The method as claimed in claim 1, wherein the quantifying is based at least on pre-processing data and the pre-processing data comprises one or both selected from:
context data describing a processing history of the at least one substrate; and/or
pre-processing metrology data acquired prior to an exposure step on the at least one substrate.

16. A computer program product comprising a non-transitory computer-readable medium comprising program instructions therein, the instructions when run on a suitable apparatus, configured to cause the apparatus to at least:
quantify, using a prediction model, a compliance metric value for a compliance metric relating to a prediction of compliance with a quality requirement based on one or both of pre-processing data associated with at least one substrate and/or any available post-processing data associated with at least one substrate; and
decide on an inspection strategy for the at least one substrate, based on the compliance metric value, an expected cost associated with the inspection strategy and at least one objective value describing an expected value of the inspection strategy in terms of at least one objective relating to the prediction model.

17. The computer program product of claim 16, wherein the at least one objective comprises at least one selected from:
monitoring and/or improving performance of the prediction model according to one or more performance metrics;
accelerating learning of the prediction model;
discovering new patterns to be recognized by the prediction model.

18. The computer program product of claim 16, wherein the at least one substrate comprises a group of substrates, the instructions configured to cause the apparatus to decide on an inspection strategy are further configured to cause the apparatus to decide whether to inspect each substrate of the group of substrates, and the compliance metric comprises a probability value describing a probability of complying with the quality requirement.

19. The computer program product of claim 18, wherein the instructions are further configured to cause the apparatus to assign a respective probability value, using the prediction model, to each substrate of the group of substrates based on its corresponding pre-processing data.

20. The computer program product of claim 18, wherein the instructions configured to cause the apparatus to decide are configurable such that the decision can be configured to impose a bias towards corresponding quantiles of the probability of a substrate complying with the quality requirement.

* * * * *